(12) United States Patent
Yang et al.

(10) Patent No.: US 9,187,648 B2
(45) Date of Patent: Nov. 17, 2015

(54) HARD COATING LAYER AND METHOD FOR FORMING THE SAME

(75) Inventors: Ji-Hoon Yang, Pohang (KR); Jae-In Jeong, Pohang (KR)

(73) Assignee: RESEARCH INSTITUTE OF INDUSTRIAL SCIENCE & TECHNOLOGY, Pohang (KR)

( * ) Notice: Subject to any disclaimer, the term of this patent is extended or adjusted under 35 U.S.C. 154(b) by 0 days.

(21) Appl. No.: 13/451,844

(22) Filed: Apr. 20, 2012

(65) Prior Publication Data

US 2013/0171474 A1    Jul. 4, 2013

(30) Foreign Application Priority Data

Dec. 28, 2011    (KR) .................... 10-2011-0145004

(51) Int. Cl.
| | | |
|---|---|---|
| *B32B 9/00* | (2006.01) | |
| *C09D 5/00* | (2006.01) | |
| *C23C 14/06* | (2006.01) | |
| *C23C 14/22* | (2006.01) | |

(52) U.S. Cl.
CPC .............. *C09D 5/00* (2013.01); *C23C 14/0641* (2013.01); *C23C 14/226* (2013.01)

(58) Field of Classification Search
None
See application file for complete search history.

(56) References Cited

U.S. PATENT DOCUMENTS

| | | | | |
|---|---|---|---|---|
| 4,761,346 A | * | 8/1988 | Naik | .............................. 428/627 |
| 4,904,528 A | * | 2/1990 | Gupta et al. | .................. 428/336 |
| 5,082,359 A | | 1/1992 | Kirkpatrick | |
| 5,238,752 A | | 8/1993 | Duderstadt | |
| 5,876,860 A | * | 3/1999 | Marijnissen et al. | ......... 428/623 |
| 6,110,604 A | | 8/2000 | Rickerby | |
| 6,395,379 B1 | * | 5/2002 | Braendle | ........................ 428/216 |
| 7,658,991 B2 | * | 2/2010 | Zhao et al. | .................... 428/323 |
| 2004/0168637 A1 | | 9/2004 | Gorokhovsky | |
| 2005/0084706 A1 | | 4/2005 | Das | |
| 2007/0128360 A1 | | 6/2007 | Gorman et al. | |
| 2008/0118643 A1 | | 5/2008 | Feuerstein | |
| 2008/0220177 A1 | | 9/2008 | Hass | |
| 2008/0317998 A1 | * | 12/2008 | Eichmann et al. | ............. 428/105 |

FOREIGN PATENT DOCUMENTS

| | | | | |
|---|---|---|---|---|
| JP | 61-255533 | | 11/1986 | |
| JP | 2004323883 | * | 11/2004 | .............. C23C 14/34 |
| JP | 2006-231433 | * | 9/2006 | .............. B32B 27/14 |

(Continued)

OTHER PUBLICATIONS http://www.merriam-webster.com/dictionary/interface.*

(Continued)

*Primary Examiner* — Humera Sheikh
*Assistant Examiner* — Seth Dumbris
(74) *Attorney, Agent, or Firm* — Lex IP Meister, PLLC

(57) ABSTRACT

The present invention relates to hard coating layer and a method for forming the hard coating layer. A method for forming hard coating layer which comprises: washing a substrate; installing the washed substrate in a vacuum equipment, and vacuating the chamber of the vacuum equipment; cleaning the substrate; forming oblique coating layer on the substrate; and forming vertical coating layer, vertically to the substrate, on the oblique coating layer by applying bias-voltage after forming oblique coating layer is provided. According to present invention, hardness of coating layer may be enhanced by forming a oblique coating layer and vertical coating layer on a substrate.

7 Claims, 4 Drawing Sheets

(56) References Cited

FOREIGN PATENT DOCUMENTS

| KR | 10-2007-0016570 | 2/2007 |
| KR | 10-2010-0087494 | 8/2010 |
| KR | 10-2010-0116682 | 11/2010 |
| KR | 10-2010-0125904 | 12/2010 |
| WO | 2009/105024 | 8/2009 |

OTHER PUBLICATIONS

D. Maheo, et al., "Microstructure and electrical resistivity of TiN films deposited on heated and negatively biased silicon substrates," Thin Solid Films, Elsevier-Sequoia S.A. Lausanne, CH, vol. 237, No. 1-2, pp. 78-86 (Jan. 1, 1994).

European Patent Office, European search report of European Patent Application No. 12165051.9 (May 31, 2013).

Gyorgy, E., et al., "Depth profiling characterisation of the surface layer obtained by pulsed Nd:YAG laser Irradiation of titanium in nitrogen". Surface and Coatings Technology, vol. 173, Issues 2-3, p. 265-270 (Aug. 2003).

Kim, Sung-Hoon, "Formation of Vertically Well-Aligned Carbon Nanotubes Bundles". Journal of the Korean Chemical Society, vol. 46, No. 5, pp. 467-470 (Oct. 2002).

* cited by examiner

HARD COATING LAYER AND METHOD FOR FORMING THE SAME

CROSS-REFERENCE TO RELATED APPLICATION

This application claims priority to and the benefit of Korean Patent Application No. 10-2011-0145004 filed in the Korean Intellectual Property Office on Dec. 28, 2011, the entire contents of which are incorporated herein by reference.

BACKGROUND OF THE INVENTION (a) Field of the Invention

The present invention relates to hard coating layer and method for manufacturing the same, more particularly, the present invention relates to hard coating layer which has columnar structure and the hard coating layer is formed by vertically coating a substrate after obliquely coating the substrate.

(b) Description of the Related Art

Generally, a method for forming hard coating is a technology that changes the composition of coating layer comprised of such as nitrides, carbides and oxides and that improves mechanical properties of the coating layer by adding heterogeneous materials.

Further, a method for forming nano-sized crystal structure in the coating layer or a method for forming multi-layered coatings that have different compositions and are in nanometer thickness has recently been highlighted.

However, in the above method, there has been a difficulty in coating process and controlling variables in coating process. And though hardness of coating layer is enhanced, the coating layer was easily broken.

SUMMARY OF THE INVENTION

The present invention has been made in an effort to provide hard coating layers that the mechanical properties are improved by changing the structures of the hard coating layers.

According to one embodiment of the invention, a method for forming hard coating layer which comprises washing a substrate, installing the washed substrate in a vacuum equipment, and vacuating the chamber of the vacuum equipment, cleaning the substrate, forming oblique coating layer on the substrate, and forming vertical coating layer, vertically to the substrate, on the oblique coating layer by applying bias-voltage after forming oblique coating layer.

In the method according to the invention, the oblique coating layer and the vertical coating layer are formed in multiple layers.

In the method according to the invention, oblique directions of the oblique coating layer are changed at opposite directions at least two times.

In the method according to the invention, the oblique coating layer and the vertical coating layer are comprised of titanium-nitride (TiN).

In the method according to the invention, the substrate is washed by ultra-sonic wave with alcohol and acetone.

In the method according to the invention, the degrees of vacuum in the chamber of the vacuum equipment is equal to or lower than $10^{-6}$ torr.

In the method according to the invention, formation of oblique and vertical coating layer is performed in degrees of vacuum between $2\times10^{-2}$ torr and $2\times10^{-4}$ torr by injecting argon gas in the vacuum equipment.

In the method according to the invention, oblique angle is between 10° and 80°.

In the method according to the invention, the bias-voltage is applied below 200V.

According to the other embodiment of the invention, hard coating layers that comprise of an oblique coating layer formed obliquely on a substrate and a vertical coating layer formed, vertically to the substrate, on the oblique coating layer is provided.

In the hard coating layers, the oblique coating layer and the vertical coating layer are formed in multi-layers.

In the hard coating layers, the oblique coating layer change oblique directions oppositely at least two times.

In the hard coating layers, the oblique and vertical coating layer is comprised of titanium-nitride (TiN).

According to the present invention, hardness of coating layer may be enhanced by forming an oblique coating layer and vertical coating layer on a substrate.

DETAILED DESCRIPTION OF THE EMBODIMENTS

Hereinafter, exemplary embodiments of the present invention will be described referring to accompanying drawings in order for a person having ordinary skill in the art to which said subject matter pertains to easily carry out the present invention.

As those skilled in the art would realize, the described embodiments may be modified in various different ways, all without departing from the spirit or scope of the present invention.

Oblique and vertical coating layers on a substrate in an exemplary embodiment of the present invention improve the hardness of the substrate and it will be described referring to FIG. 3 and FIG. 4.

Figure 3:
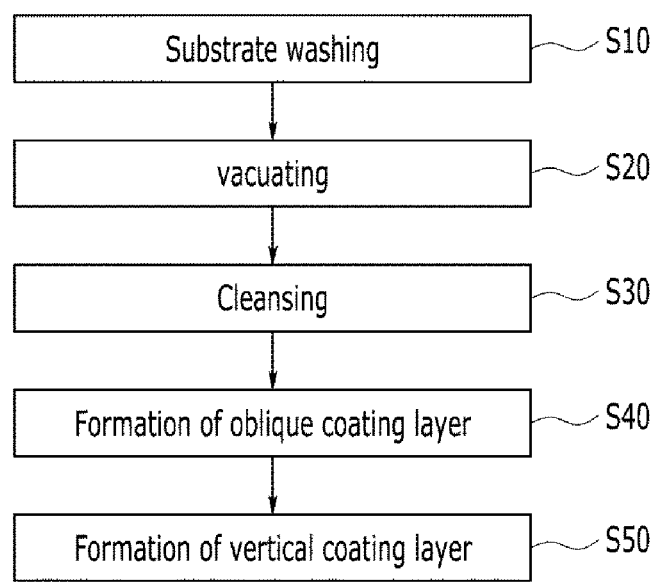
FIG. 3 is a process flowchart for forming hard coating layers on a substrate according to an exemplary embodiment of the present invention.
Figure 4:
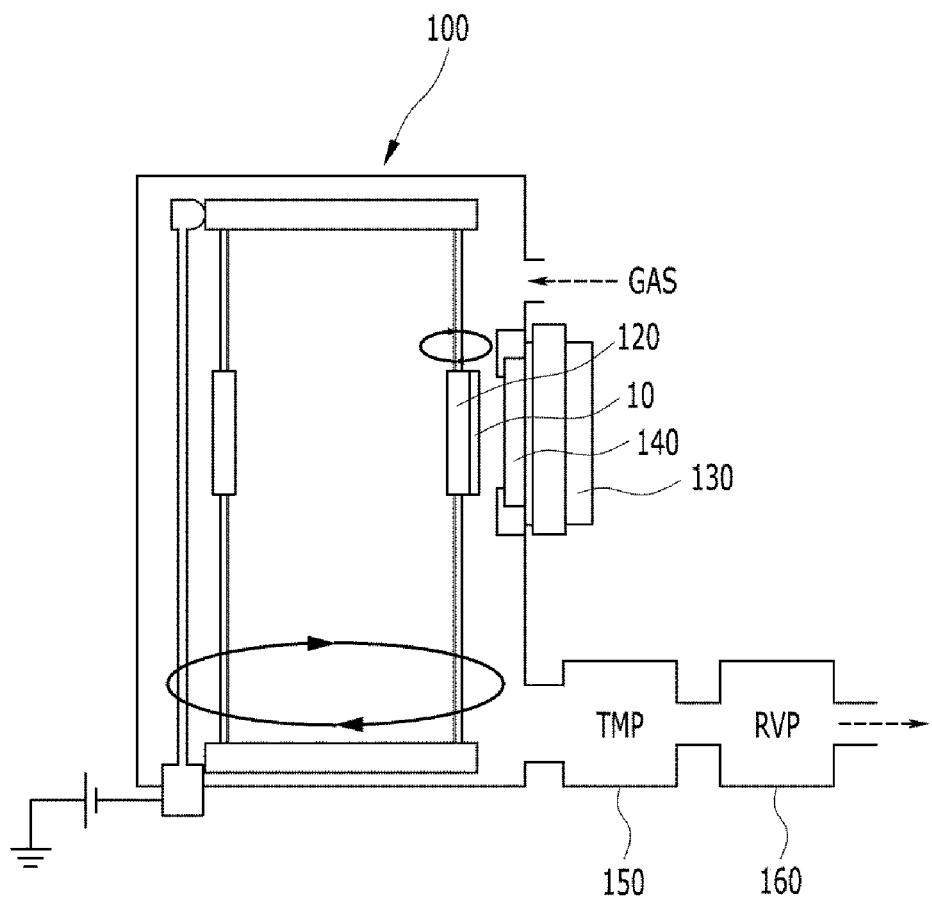
FIG. 4 is a schematic diagram of vacuum coating equipment according to an exemplary embodiment of the present invention.

FIG. 3 is a process flowchart for forming hard coating layer according to an exemplary embodiment of the present invention, and FIG. 4 is a schematic diagram of vacuum coating equipment according to an exemplary embodiment of the present invention.

First, before forming coating layer, the substrate 10 is washed (S10), and the washed substrate 10 is installed in a vacuum equipment 100, and the chamber of the vacuum equipment 100 is vacuated (S20) and the substrate 10 is cleansed (S30).

And then, a coating layer is formed on the cleansed substrate 10. The substrate 10 is coated obliquely by rotating a substrate holder 120 according to an exemplary embodiment of the present invention.

An oblique coating layer is formed on the substrate 10 by the above coating process (S40), and after oblique coating layer 20 is formed, vertical coating layer 30 is formed, vertically to the substrate 10, on the oblique coating layer 20 by applying bias-voltage.

That is, structures of coating layer are changed by forming the vertical coating layer 30 on the oblique coating layer 20.

The vertical coating is formed to improve Young's Modulus and hardness and the oblique coating is formed to improve weakness from brittleness and not to be easily broken.

The oblique coating layer 20 and the vertical coating layer 30 can be formed in multiple layers, and in particular the oblique coating layers can be formed with the oblique directions of the oblique coating layers being changed in opposite directions at least two times like zigzag or < shapes, the zigzag or < shapes can be obtained by rotating the substrate holder 120 supporting the substrate 10.

The reason why the coating layers 20 and 30 are formed obliquely and vertically is to change the microstructures by applying bias-voltage.

Figure 1:
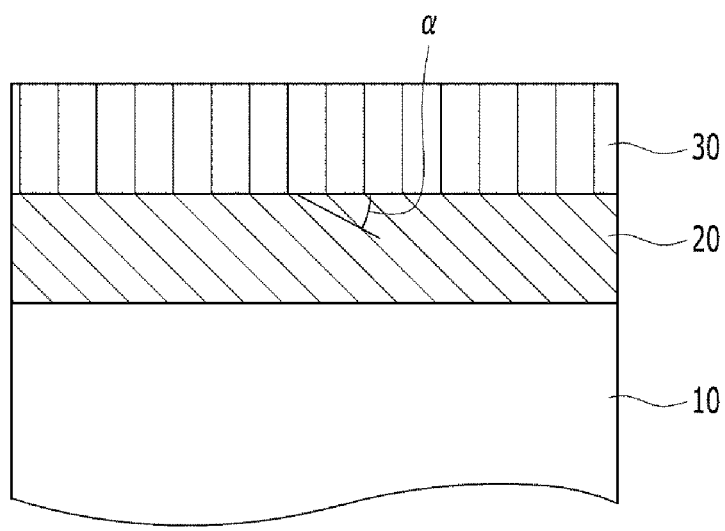
FIG. 1 is a cross-sectional view of hard coating layer formed on a substrate according to an exemplary embodiment of the present invention.
Figure 2:
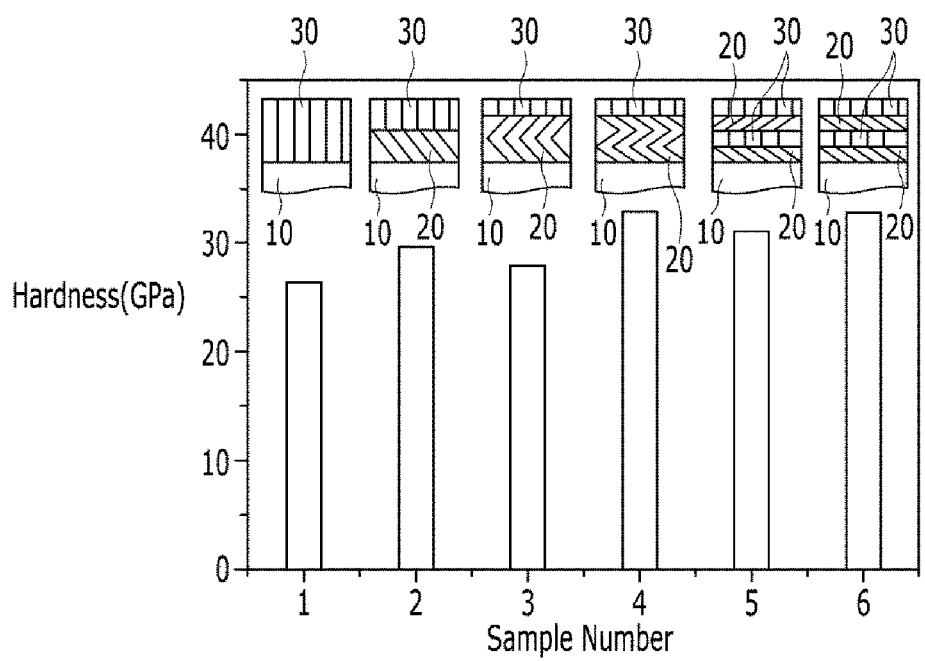
FIG. 2 is a graph showing hardness test results of coating layer according to structures of hard coating layer according to an exemplary embodiment of the present invention.

The oblique coating layer 20 and the vertical coating layer 30 can be formed over and over at least two times, and the laminated configurations of the oblique coating layer 20 and the vertical coating layer 30 are showed in the FIG. 1 and FIG. 2.

FIG. 1 shows hard coating layers formed on a substrate according to an exemplary embodiment of the present invention and FIG. 2 is a graph showing hardness test results of a plurality of the hard coating layers according to an exemplary embodiment of the present invention.

Titanium-nitride (TiN) is used as material for the coating layers in the exemplary embodiment of the present invention, however it is just an exemplary embodiment of the present invention, so zirconium (Zr), titanium-aluminum (TiAl), nitrides and carbides can be used.

The substrate 10 is washed by ultrasonic wave with alcohol and acetone before coating process, and the degrees of vacuum in the chamber of the vacuum equipment is maintained at equal to or lower than $10^{-6}$ torr before the coating process.

After vacuating the chamber of the vacuum equipment 100, argon gas is provided into the chamber of the vacuum equipment 100 to make the chamber high vacuum state.

The coating process is performed in the range of $2\times10^{-2}$ torr to $2\times10^{-4}$ torr in the degree of vacuum aspect.

When the degree of vacuum is lower than $2\times10^{-2}$ torr, the deposition rate will be lowered because the metal-ions, generated by arc, are blocked by the other obstacles like the other ions and cannot arrive at the substrate 10. Whereas the degree of vacuum is higher than $2\times10^{-4}$ torr, plasma or arc cannot be generated because the number of gaseous molecules is so reduced that the possibility of sputtering is reduced.

In addition, it is desirable that the bias-voltage for forming vertical coating layer 30 according to the exemplary embodiment of the present invention is below 200V. If the bias-voltage exceeds 200V, re-sputtering, that is sputtering not a coating, happens because gaseous ions are accelerated toward the substrate.

It is sufficient that the oblique angle α is acute and more specifically, it is desirable that the size of oblique angle is between 10° and 80°.

As the horizontal growth of the said coating layer is suppressed due to shadowing effect, normally coating layer with angle at least 10° is formed, and if the size of oblique angles exceeds 80°, even if oblique angle of the oblique coating layer 20 is close to vertical angle, the hardness increase of the coating layer is negligible, so the oblique angle is limited to the above range.

Exemplary embodiments of the present invention are explained more specifically as below.

In the exemplary embodiments of the present invention, compared with conventional coating layer that coating layer is formed on the substrate vertically, oblique coating layer is formed.

The oblique coating layer is used to control the structure of coating layer and to form a variety of coating structure of coating layer.

The structures that can be made by oblique coating are such as, zigzag, spiral, oblique cylinder and the structures made by oblique coating can be applied to gas sensors due to large specific areas compared to conventional coating layer.

The structure of the exemplary embodiment of the present invention is not the same with the said structure but is close to oblique columnar structure.

The physical properties of coating layer can be changed from the structural changes of the coating layer and the formation of multi-layered coating.

The exemplary embodiment of the present invention comprises of process for forming coating layer by structure design of hard coating layer and vacuum coating method. The material for the substrate 10 of the exemplary embodiment of the present invention is stainless steel.

After the substrate 10 is washed by ultra-sonic wave with alcohol and acetone, the substrate 10 is installed in a vacuum equipment 100 and the vacuum equipment 100 was vacuated in $10^{-6}$ torr with turbo molecular pump (TMP) 150 and rotary vane pump (RVP) 160.

When degree of vacuum is in $7\times10^{-4}$ torr by providing argon gas (Ar) into the vacuum equipment 100 after vacuating the vacuum equipment 100, cleaning the substrate 10 is performed by applying about 400V into the substrate 10 from arc generated by applying direct current (DC) to cathodic arc source 130 that titanium target 140 is installed.

When cleansing the substrate 10 is finished, titanium-nitride coating layer is formed by providing argon gas together with nitrogen gas at the same pressure when the substrate is cleansed.

When forming a titanium-nitride (TiN) coating layer, coating is conducted by rotating the substrate holder 120 in order to the substrate 10 and the cathodic arc source 130 is in oblique angle instead of vertical angle. The oblique angle is 45°.

When a desired thickness for oblique coating is finished, a top coating layer is formed by applying electric field about 100V into the substrate 10 while the substrate holder 120 is tilted.

The process for forming coating is finished when a desired thickness of the top layer is accomplished.

In the exemplary embodiment of the present invention, coating layers with a variety of coating shapes were formed as shown in FIG. 2, the hardness of comparative example that only vertical coating layer 30 was formed on the substrate was 26 GPa, while the hardness of sample No. 4 that vertical coating layer was formed after oblique coating layer was formed in zigzag was 34 GPa.

Further, when oblique coating layer 20 and vertical coating layer 30 were formed repeatedly by two times (sample No. 6), the hardness of the coating layer exceeded 30 GPa.

Compared to sample No. 2 that oblique and vertical coating layer is formed at once respectively, the hardness of sample No. 6 that oblique and vertical coating layer is formed twice is enhanced.

Generally, the hardness of titanium-nitride can't exceed 30 GPa, the hardness of coating layer that formed in the exemplary embodiment of the present invention can exceed 30 GPa.

The exemplary embodiments of the present invention make coating layer grows vertically with regard to the substrate 10 by applying electric filed into the substrate 10 while forming oblique coating layer on the substrate 10 by tilting the substrate 10.

Coating layers with a variety of coating shapes may be formed with the aid of oblique coating and electric field. Hardness of hard coating layer is highly enhanced by forming vertical coating layer on the oblique coating layer with electric field after forming oblique coating layer on the substrate 10.

While this invention has been described in connection with what is presently considered to be practical exemplary embodiments, it is to be understood that the invention is not limited to the disclosed embodiments.

On the contrary, it is intended to cover various modifications and equivalent arrangements included within the spirit and scope of the appended claims.

What is claimed is:

1. Hard coating layers that comprise:
   an oblique coating layer formed obliquely, and directly on a substrate; and
   a vertical coating layer formed, vertically to the substrate, on the oblique coating layer,
   wherein the oblique coating layer and the vertical coating layer are formed by a deposition method performed by generating arc or plasma,
   wherein the vertical coating layer is formed by applying a bias-voltage during the deposition, after forming the oblique coating layer, and
   wherein a hardness of the vertical coating layer exceeds 30 GPa.

2. The hard coating layers of claim 1, wherein the oblique coating layer and the vertical coating layer are formed in multi-layers.

3. The hard coating layers of claim 2, wherein the oblique coating layer changes oblique directions oppositely at least two times.

4. The hard coating layers of claim 2, wherein the oblique and vertical coating layers are comprised of titanium-nitride (TiN).

5. The hard coating layers of claim 1, wherein the oblique coating layer changes oblique directions oppositely at least two times.

6. The hard coating layers of claim 1, wherein the oblique and vertical coating layers are comprised of titanium-nitride (TiN).

7. The hard coating layers of claim 1, wherein the bias-voltage is less than 200 volts.

* * * * *